(12) United States Patent
Hernandez et al.

(10) Patent No.: US 6,711,001 B2
(45) Date of Patent: Mar. 23, 2004

(54) CHASSIS BUSHING ASSEMBLY

(75) Inventors: David J. Hernandez, Round Rock, TX (US); Damon W. Broder, Austin, TX (US); Darren B. Pav, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 2 days.

(21) Appl. No.: 10/173,088

(22) Filed: Jun. 17, 2002

(65) Prior Publication Data

US 2003/0231461 A1 Dec. 18, 2003

(51) Int. Cl.$^7$ .................................................. G06F 1/16
(52) U.S. Cl. ........................ 361/679; 361/683; 361/801; 411/11; 248/568
(58) Field of Search ................................ 361/679, 683, 361/753, 796, 800–801; 174/35 R, 51; 312/223.1, 223.2, 223.3; 411/10, 11; 206/708, 719; 248/634, 638, 568, 570; 180/68.4, 68.5

(56) References Cited

U.S. PATENT DOCUMENTS

| | | | |
|---|---|---|---|
| 4,858,866 A | * 8/1989 | Werner ..................... 248/213.3 |
| 4,908,715 A | * 3/1990 | Krum et al. ............. 360/97.02 |
| 5,466,077 A | 11/1995 | Movaghar et al. .......... 400/354 |
| 5,771,152 A | 6/1998 | Crompton et al. .......... 361/681 |
| 5,995,363 A | * 11/1999 | Wu ............................. 361/679 |
| 5,999,416 A | * 12/1999 | McAnally et al. .......... 361/816 |
| 6,028,737 A | 2/2000 | Khuu ....................... 360/99.06 |
| 6,065,732 A | 5/2000 | Cho ............................ 248/371 |
| 6,213,438 B1 | 4/2001 | Ostby et al. ............. 248/276.1 |
| 6,498,727 B2 | * 12/2002 | Carr ........................... 361/725 |

* cited by examiner

Primary Examiner—Michael Datskovsky
(74) Attorney, Agent, or Firm—Baker Botts L.L.P.

(57) ABSTRACT

A chassis bushing assembly is provided. The chassis bushing assembly includes an outer disc and an inner disc. The outer disc includes a lip and has first face and a second face. The inner disc includes a shoulder and has a third face and a fourth face. In addition, the inner disc coaxially mates with the outer disc. The chassis bushing assembly further includes a first aperture extending through the first and second faces of the outer disc and a second aperture, coaxially located with respect to the first aperture, extending through the third and fourth faces of the inner disc. The chassis bushing assembly is symmetrical so that each chassis bushing location within a chassis utilizes the same chassis bushing assembly. In addition, the chassis bushing assembly is common across different chassis types and backwards compatibly with previous chassis designs.

17 Claims, 2 Drawing Sheets

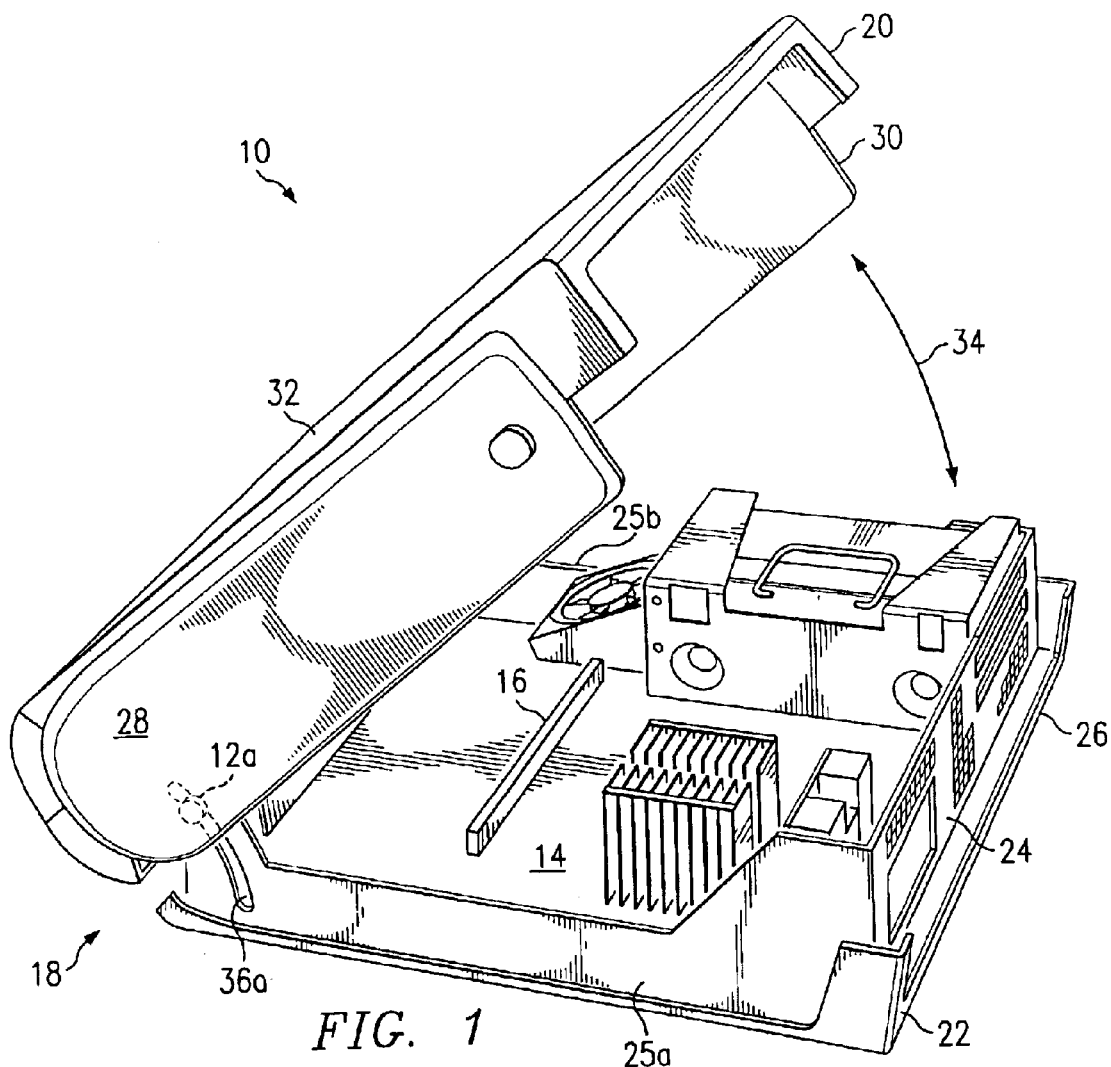
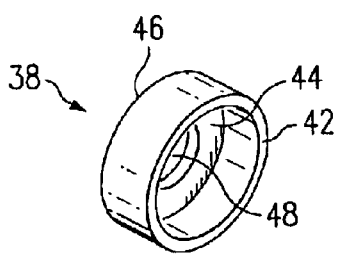
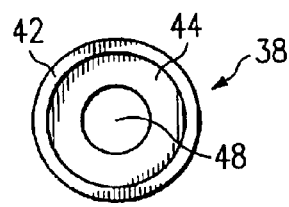
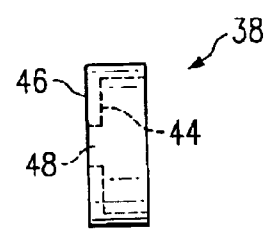
FIG. 1
FIG. 4A   FIG. 4B   FIG. 4C
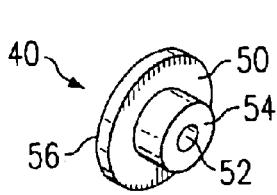
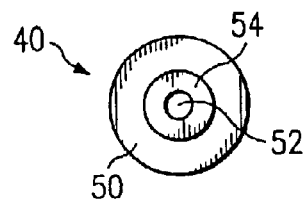
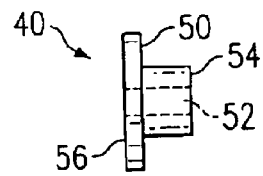
FIG. 5A   FIG. 5B   FIG. 5C

CHASSIS BUSHING ASSEMBLY

TECHNICAL FIELD

This disclosure relates in general to the field of component chassis, and more particularly to a chassis bushing assembly.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The ability to access the internal components of an information handling system such as a computer system is important in the manufacturing of a computer system, the servicing of a computer system and using a computer system. Therefore, the opening and closing of a chassis for an information handling system should be easily done and repeatable without wear on the chassis. To allow for access, chassis are generally composed of two different sections that are coupled together by fasteners such as hinges, screws, or slides that allow for the opening and closing of the chassis without separating the chassis into two separate pieces. A typical chassis design may include one section having two banana-shaped slots with a banana-shaped bushing in each slot with the second section having a fastener assembly coupled to the two sections that travels along the banana-shaped bushing. The fastener assembly traveling in the banana-shaped bushing creates a folder friction hinge and allow for the opening and closing of the chassis without completely separating the two sections.

But the banana-shaped bushings increase the cost of an information handling system because the banana-shaped bushings are specific to each banana-shaped slot. The banana-shaped bushing are not symmetrical and each banana-shaped bushing has tooling specific to each side of the chassis which results in each banana-shaped bushing having its own part number. Therefore, each chassis requires two different banana-shaped bushings. Having two different banana-shaped bushings for each chassis drives inventory control costs by requiring each specific banana-shaped bushing to be keep in inventory resulting in increased costs for the assembly of the information handling systems.

In addition, different chassis have different sized banana-shaped slots so that each chassis has its own specific set of banana-shaped bushings. Therefore, if there are four different chassis each having two banana-shaped slots, none of which are the same, eight different banana-shaped bushing are needed to be kept in inventory at all times which increases inventory costs. And because each banana-shaped bushing is specific to a particular chassis, there is no commonization across the chassis with respect to the banana-shaped bushings and no backwards compatibility with previous chassis designs incorporating the banana-shaped slots.

Another problem with the banana-shaped bushings is that the banana-shaped bushings are costly to manufacture because of the unique shape and the manufacturing material. The banana-shaped bushings are made of a custom resin, such as a glass filled plastic, that is difficult to mold. The plastic mold tooling used to create and mold the banana-shaped bushings wear out more quickly than normal because glass filled plastic is harder to mold than other types of plastics. In addition, the irregular shape of the banana-shaped bushing adds to the manufacturing cost because the shape is more complex and therefore more difficult to mold. Therefore, tool maintenance is high when manufacturing the banana-shaped bushing because molding the banana bushing is hard on the plastic mold tooling and results in the premature wearing of the tooling.

SUMMARY

Therefore, a need has arisen for a chassis bushing assembly that is symmetrical with respect to each chassis.

A further need has arisen for a chassis bushing assembly that is common across all chassis designs and backwards compatible with previous chassis designs.

A further need has arisen for a chassis bushing assembly that can be manufactured at a lower production cost.

In accordance with the teachings of the present disclosure, an information handling system and chassis bushing assembly are described which substantially eliminate or reduce disadvantages with previous chassis bushing assemblies. The chassis bushing assembly allows for an inexpensive and symmetrical chassis bushing that is common across both current and previous chassis designs.

In accordance with one aspect of the present disclosure, a chassis bushing assembly is provided. The chassis bushing assembly preferably includes an outer disc and an inner disc. The outer disc includes a lip and has a first face and a second face. The inner disc includes a shoulder, a third face, and a fourth face, and coaxially mates with the outer disc. A first aperture extends through the first and second faces of the outer disc while a second aperture extends through the third and fourth faces of the inner disc and is coaxially located with respect to the first aperture.

In one embodiment, the chassis bushing assembly includes a chassis having a folder section and base section. The folder section includes at least one folder aperture and at least one emboss while the base section includes at least one curved slot. The inner disc is disposed between the folder section and base section. A mechanical faster is disposed in the first aperture, second aperture, and folder aperture to operably couple the folder section, inner disc, base section, and outer disc and allow the inner disc and the outer disc to travel in the curved slot as the chassis is opened and closed.

In another aspect of the present disclosure, an information handling system having a chassis, a motherboard disposed within the chassis, the motherboard including at least one processor, an outer disc, an inner disc, and a mechanical fastener is provided. The chassis includes a folder section and a base section. The outer disc includes a lip, a first face, and a second face with a first aperture extending through the first and second faces. The inner disc is disposed between the folder section and the base section and includes a shoulder, a third face, and fourth face with a second aperture extending through the third and fourth faces. The mechanical fastener extends through the first and second apertures and couples the inner disc and outer disc.

The present disclosure provides a number of important technical advantages. One important technical advantage is a chassis bushing assembly that is symmetrical with respect to each chassis. Because the chassis bushing is symmetrical, different parts are not required for each of the banana-shaped slots on a chassis. The costs of an information handling system decreases because two different chassis bushings are not required for each chassis—the same inner disc and outer disc are used for each banana-shaped slot. Because the same chassis bushing can be used for each banana-shaped slot on the chassis, the number of parts and therefore the part cost per chassis decreases resulting in a overall decrease in the cost of the information handling system.

Another important technical advantage of the present disclosure is a chassis bushing assembly that is common across all current chassis designs and backwards compatible with previous chassis designs. Having a chassis bushing that is common across all chassis eliminates the need to have an inventory of different chassis bushings for each chassis type. Therefore, inventory costs decrease because only the inner disc and the outer disc need to be kept in inventory instead of a different banana-shaped bushing for each chassis. This results in a decrease in the cost of manufacture for the information handling system due to the decrease in inventory costs. Inventory costs are further reduced because the chassis bushing is backwards compatible with previous generations of chassis types. Therefore, previous types of chassis bushings such as the banana-shaped bushing no longer need to be kept in inventory because the chassis bushing assembly may be used on the older chassis types. Backwards compatibility further reduces inventory costs which further decreases the cost of the information handling system.

Another important technical advantage of the present disclosure is a lower production cost. The lower production cost results in a lower cost for the corresponding chassis and information handling system. The chassis bushing assembly may be manufactured from plastic that is not glass filled which is easier to mold than glass filled plastic. Since non-glass filled plastic is easier to mold, the tooling costs for the production of the chassis bushing decreases and the life of the tools increases. In addition, the disc shape of the chassis bushing assembly of the present disclosure is less difficult to manufacture than the complex and irregular design and shape of the banana-shaped bushing.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1 is a schematic representation of an information handling system incorporating the chassis bushing assembly;

FIG. 4A depicts an isometric view of the outer disc of the chassis bushing assembly;

FIG. 4B depicts a front view of the outer disc of the chassis bushing assembly;

FIG. 4C illustrates a side view of the outer disc of the chassis bushing assembly;

FIG. 5A illustrates an isometric view of the inner disc of the chassis bushing assembly;

FIG. 5B depicts a front view of the inner disc of the chassis bushing assembly; and FIG. 5C illustrates a side view of the inner disc of the chassis bushing assembly.

DETAILED DESCRIPTION

Figure 2:
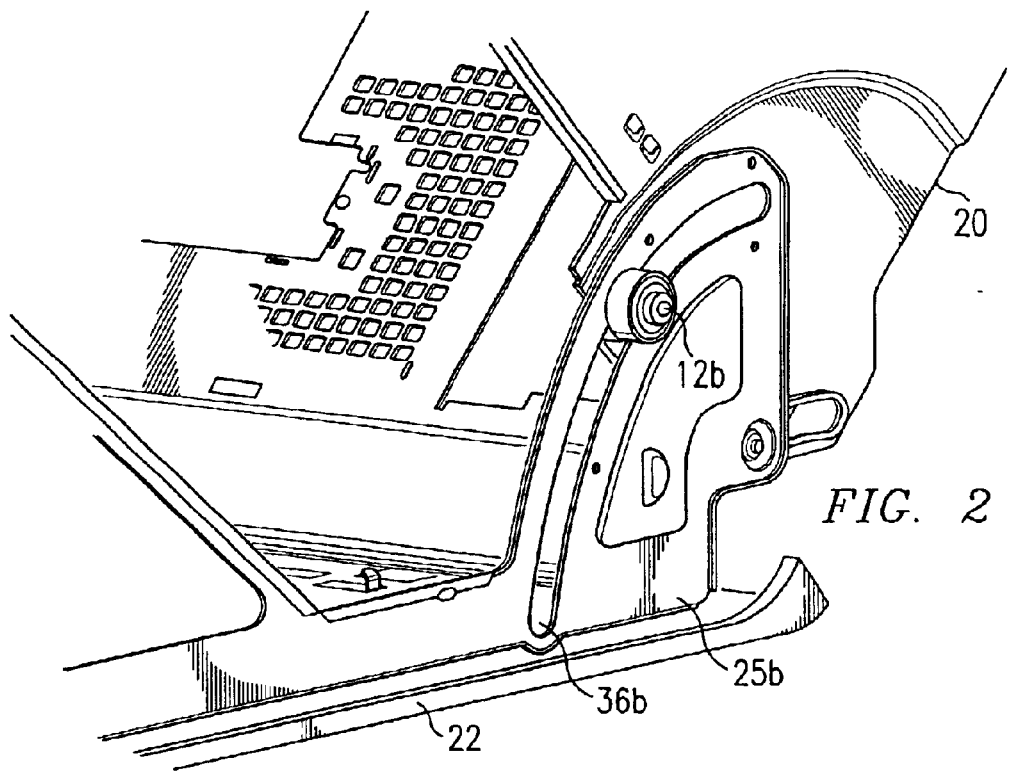
FIG. 2 is a detailed schematic representation of the chassis bushing assembly installed within a chassis.

Preferred embodiments and their advantages are best understood by reference to FIGS. 1 through 5, wherein like numbers are used to indicate like and corresponding parts.

Under previous chassis bushing assemblies, the chassis bushings for an information handling system have been designed and built specific to a particular chassis resulting in greater inventory requirements for the different chassis bushings and increased inventory costs. Also, the chassis bushings are not symmetrical requiring two different chassis bushings per chassis therefore creating greater costs. In addition, the multiple types of chassis bushings cannot be used across multiple chassis, including both current chassis designs and previous chassis designs. The present disclosure allows for a symmetrical chassis bushing assembly that is common across multiple chassis designs thereby reducing inventory and overall costs.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

FIG. 1 is a schematic representation of information handling system 10 incorporating two chassis bushing assemblies 12. Information handling system 10 may be a computer system such as a desktop computer or a server. Information handling system 10 includes motherboard 14 that includes at least one processor 16.

Information handling system 10 also includes chassis 18 which encloses computing components such as motherboard 14 and processor 16. Chassis 18 is composed of two different sections—folder section 20 and base section 22. Folder section 20 and base section 22 couple together to create an enclosed housing to house and protect the internal computing components of information handling system 10 and allow for room for additional computing components. Base section 22 includes back side 24, base side 26, and two slot sides 25. Folder section 20 includes bottom side 28, top side 30, and folder side 32.

A user opens and closes chassis 18 by separating and placing together folder section 20 and base section 22. Folder section 22 couples to base section 22 at slot sides 25 to form chassis 18. Folder section 20 and base section 22 do not uncouple and completely separate from each other but do open wide enough to allow sufficient access to the computing components enclosed within chassis 18 to allow for servicing or the addition or removal of computing components.

Information handling system 10 is a tower configuration and is shown resting on base side 26 in FIG. 1. When in the tower configuration, chassis bushing assembly 12b is located adjacent top side 30 of chassis 18 and chassis bushing assembly 12a is located adjacent bottom side 28 of chassis 18. In the tower configuration, a user may open and close chassis 18 in different ways. The user may place chassis 18 horizontal as shown in FIG. 1 and move folder section 20 away from and towards base section 22 in a vertical plane of movement along a path as shown by arrow 34 to open and close chassis 18. A user may also decide to open chassis 18 when chassis 18 is in a vertical configuration by keeping chassis upright on bottom side 28 so that folder section 20 is disposed adjacent base section 22. With chassis 18 resting on bottom side 28, a user may pull folder section 20 horizontally away from and to base section 22 to open chassis 18. The motion of folder section 20 moving away from and towards base section 22 is the same regardless of whether chassis 18 is upright on bottom side 28 or resting on base side 26. The only difference is whether folder section 20 travels in a horizontal plane or a vertical plane.

Although the embodiment shown in FIG. 1 illustrates information handling system 10 and chassis 18 in a tower configuration shown resting on base side 26, information handling system 10 and chassis 18 may also be configured in a desktop configuration. A desktop configuration is similar to the tower configuration when chassis 18 in a tower configuration is placed on base side 26 as described above. In the desktop configuration, folder section 20 is disposed above base section 22 and rests on base section 22. Instead of being located adjacent the top and bottom of chassis 18, in desktop configuration chassis bushing assemblies 12 are located on the left and right sides of chassis 18. A user moves folder section 20 up and away from base section 22 to open chassis 18 instead of moving folder section 20 horizontally away from base section 22 as in the tower configuration.

FIG. 2 is a detailed schematic representation of chassis bushing assembly 12b installed within chassis 18. Chassis 18 is in the tower configuration, has been placed on base side 26, and is in an open position. Also shown in greater detail is slot side 25b. Slot side 25b includes curved slot 36b where curved slot 36b may be referred to as having a banana-shape. Slot side 25a and chassis bushing assembly 12a are not shown in FIG. 2. Slot side 25a is symmetrical to slot side 25b and includes curved slot 36a similar to curved slot 36b. Chassis bushing assembly 12a is symmetrical with chassis bushing assembly 12b so that the operation of chassis bushing assembly 12a in curved slot 36a of slot side 25a parallels the operation of chassis bushing assembly 12b in curved slot 36b.

Previous chassis bushing types typically utilized a plastic curved or banana-shaped bushing disposed within curved slots 36 with the banana-shaped bushing having a smaller curved or banana-shaped slot. A spring screw assembly coupled to folder section 20 and base section 22 travels along the banana-shaped bushing and creates a friction engine allowing for the opening and closing of chassis 18. But the banana-shaped bushing placed in curved slots 36 are chassis specific so that one model of chassis may require a particular type of banana-shaped bushing while another model of chassis requires a different banana-shaped bushing. In addition, the banana-shaped bushing placed in curved slot 36a was a different part from the banana-shaped bushing placed in curved slot 36b because the banana-shaped bushings are chassis specific and non-symmetrical.

Figure 3:
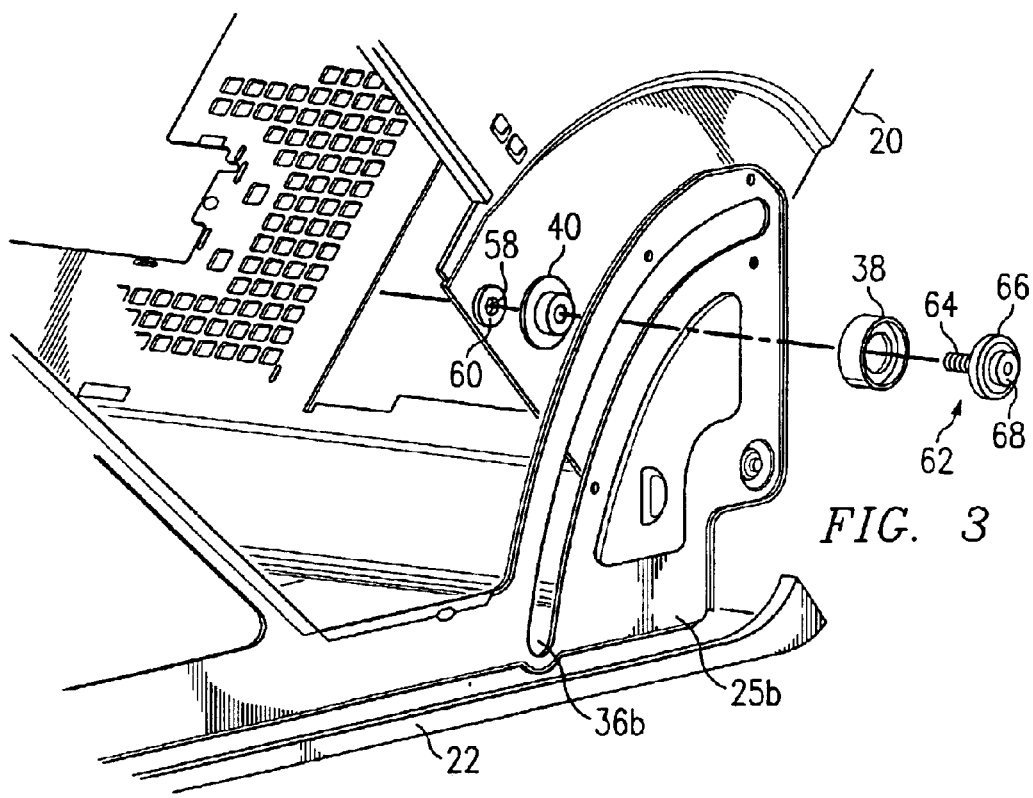
FIG. 3 is an exploded view of the chassis bushing assembly.

The present disclosure eliminates the banana-shaped bushing and instead provides chassis bushing assembly 12 that is symmetrical, functions with both curved slot 36a and 36b, and is common across different types of chassis. FIG. 3 illustrates an exploded view of chassis bushing assembly 12. Chassis bushing assembly 12 includes outer disc 38 and inner disc 40 with outer disc 38 depicted in greater detail in FIGS. 4A, 4B, and 4C and inner disc 40 illustrated in greater detail in FIGS. 5A, 5B, and 5C. FIG. 4A depicts an isometric view of outer disc 38, FIG. 4B depicts a front view of outer disc 38, and FIG. 4C illustrates a side view of outer disc 38. FIG. 5A illustrates an isometric view of inner disc 40, FIG. 5B depicts a front view of inner disc 40, and FIG. 5C illustrates a side view of inner disc 40.

Outer disc 38 and inner disc 40 may be manufactured out of a thermoplastic containing no glass fragments or any other appropriate non-glass filled plastics. Non-glass filled plastic is easier to mold than glass filled plastic thereby resulting in increased tool life and decreased tool wear for the plastic molding tools used to create and mold outer disc 38 and inner disc 40. Because of the increased tool life and decreased tool wear when producing outer disc 38 and inner disc 40, the cost to produce outer disc 38 and inner disc 40 decreases which results in a decrease in the overall cost of information handling system 10.

Referring back to FIG. 3, folder section 20 includes folder aperture 58 and emboss 60. Folder aperture 58 may be an extruded hole in folder section 20. Located proximate and coaxially with folder aperture 58 is emboss 60. Emboss 60 includes internal threads operable to couple with a mechanical faster such as a screw, a bolt, or any other appropriate mechanical fastener.

Chassis bushing assembly 12 includes both outer disc 38 and inner disc 40. Inner disc 40 is disposed between folder section 20 and base section 22 such that emboss 60 couples with fourth face 56 of inner disc 40 and third face 54 is disposed within curved slot 36b and first aperture 48. Second aperture 52 of inner disc 40 is located coaxially with folder aperture 58 and emboss 60. Shoulder 50 of inner disc 40 rests against base section 22 and prevents inner disc 40 from coming completely through curved slot 36b and helps to keep inner disc 40 in curved slot 36b. Outer disc 40 is disposed adjacent base section 22 opposite of inner disc 40. Second face 46 of outer disc 38 couples with base section 22. First aperture 48 of outer disc 38 is located coaxially with second aperture 52, folder aperture 58, and emboss 60. Inner disc 40 mates through curved slot 36b with first aperture 48 of outer disc 38 to create chassis bushing assembly 12.

Chassis bushing assembly 12 may further include mechanical fastener 62. Mechanical fastener 62 may be a conical spring screw or helical screw and include threaded member 64, spring 66, and head 68. Mechanical fastener 62 is coaxially disposed within first aperture 48, second aperture 52, folder aperture 58, and emboss 60 to operably couple folder section 20, base section 22, outer disc 38, and inner disc 40 and thereby create a friction engine for chassis bushing assembly 12 as shown in FIG. 2. Threaded member 64 engages the inner threads of emboss 60 and is tightened into emboss 60 and folder aperture 58 to coaxially align outer disc 38 and inner disc 40 and to hold mechanical fastener 62, outer disc 38, and inner disc 40 coaxially in place. Spring 66 and head 68 of mechanical fastener 62 rest on first face 44 of outer disc 38 with spring 66 contained within outer disc 38 by lip 42. The coupling of mechanical fastener 62 with outer disc 38 and inner disc 40 creates a spring force for the operation of the friction engine for chassis bushing assembly 12.

In operation, outer disc 38 and inner disc 40 are coupled to folder section 20 and base section 22 with outer disc 38 and inner disc 40 working in tandem to facilitate the opening and closing of chassis 18. Inner disc 40 travels in and along curved slot 36b whenever the user opens or closes chassis 18 and rests in curved slot 36b when folder section 20 and base section 22 are stationary with respect to each other. Inner disc 40 travels in curved slot 36b instead of mechanical fastener 62 traveling along a banana-shaped bushing disposed in curved slot 36b as in previous chassis bushings. Shoulder 50 and outer disc 38 (with second face 46 coupled to base section 22) travel along either side of base section 22 helping to create the friction engine for chassis bushing assembly 12. The circular shape of outer disc 38 and inner disc 40 allows outer disc 38 and inner disc 40 to rotate independently while providing the necessary friction dampening for chassis 18.

Outer disc 38, inner disc 40, and mechanical fastener 62 mate together thereby requiring little assembly time. Outer disc 38 and inner disc 40 perform a bushing function and are the moving parts of the friction engine for chassis bushing assembly 12. The design of outer disc 38 and inner disc 40 is symmetrical and allows the same outer disc 38 and inner disc 40 to be used for both curved slots 36a and 36b in chassis bushing assembly 12a and 12b. Therefore, two separate chassis bushings are not required for a single chassis 18. Since two different chassis bushing are not required, the part cost for information handling system 10 decreases. In addition, outer disc 38 and inner disc 40 will operate as chassis bushing assembly 12 for any curved slot and mechanical fastener and is not limited to banana-shaped slots or particular types of mechanical fasteners. Therefore, chassis bushing assembly 12 may be utilized across a wide variety of chassis, including both current and previous chassis designs.

Chassis bushing assembly 12 further reduces costs because less material is required to fabricate outer disc 38 and inner disc 40 compared with previous chassis bushings. In addition, inventory costs are reduced because a manufacturer of information handling systems 10 generally only needs to keep two parts (outer disc 38 and inner disc 40) in inventory instead of a different chassis bushing for each curved slot 36 and chassis 18.

Although the disclosed embodiments have been described in detail, it should be understood that various changes, substitutions and alterations can be made to the embodiments without departing from their spirit and scope.

What is claimed is:

1. A chassis bushing assembly comprising:
    an outer disc including a lip, the outer disc having a first face and a second face;
    an inner disc including a shoulder and operable to coaxially mate with the outer disc, the inner disc having a third face and a fourth face;
    a first aperture extending through the first and second faces of the outer disc; and
    a second aperture coaxial with the first aperture, the second aperture extending through the third and fourth faces of the inner disc.

2. The chassis bushing assembly of claim 1 further comprising a mechanical faster disposed in the first and second apertures.

3. The chassis bushing assembly of claim 2 wherein the mechanical fastener comprises a conical spring screw.

4. The chassis bushing assembly of claim 2 wherein the mechanical fastener includes a spring, the spring disposed within the lip of the outer disc adjacent the first face.

5. The chassis bushing assembly of claim 1 further comprising the inner disc disposed within the first aperture.

6. The chassis bushing assembly of claim 1 further comprising a chassis, the outer disc and inner disc disposed within the chassis.

7. The chassis bushing assembly of claim 6 wherein the chassis comprises:
    a folder section including at least one folder aperture and at least one emboss; and a base section including at least one curved slot.

8. The chassis bushing assembly of claim 7 further comprising the inner disc disposed between the base section and the folder section.

9. The chassis bushing assembly of claim 7 further comprising the outer disc disposed proximate the base section and coaxially opposed to the inner disc.

10. The chassis bushing assembly of claim 7 further comprising a mechanical fastener disposed in the folder aperture of the folder section and operably coupled to the emboss.

11. The chassis bushing assembly of claim 10 wherein the mechanical fastener operably couples the base section, the folder section, the inner disc, and the outer disc.

12. The chassis bushing assembly of claim 11 wherein the inner disc travels in the curved slot in the base section with the outer disc following the travel of the inner disc thereby allowing for the movement of the folder section with respect to the base section.

13. The chassis bushing assembly of claim 11 further comprising the inner disc and the outer disc coaxially aligned with the mechanical fastener, the folder aperture, and the emboss.

14. A chassis bushing assembly comprising:

an outer disc including a lip and having first and second faces with a first aperture extending therethrough;

an inner disc disposed proximate the outer disc, the inner disc including a shoulder and having third and fourth faces with a second aperture extending therethrough coaxially with the first aperture, the third face operable to coaxially mate with the second face of the outer disc; and a mechanical faster disposed in the first and second apertures, the mechanical fastener operable to couple the inner disc and the outer disc.

15. The chassis bushing assembly of claim 14 further comprising the outer disc and inner disc disposed within a chassis, the chassis including:

a folder section including at least one folder aperture and at least one emboss; and a base section including at least one curved slot.

16. The chassis bushing assembly of claim 15 further comprising the inner disc disposed between the folder section and the base section.

17. The chassis bushing assembly of claim 15 further comprising the inner disc and the outer disc coaxially aligned with the mechanical fastener, the emboss, and the folder aperture.

* * * * *